United States Patent
Lv et al.

(10) Patent No.: US 9,570,482 B2
(45) Date of Patent: Feb. 14, 2017

(54) MANUFACTURING METHOD AND MANUFACTURING EQUIPMENT OF THIN FILM TRANSISTOR SUBSTRATE

(71) Applicant: Shenzhen China Star Optoelectronics Technology Co., Ltd., Shenzhen, Guangdong (CN)

(72) Inventors: Xiaowen Lv, Guangdong (CN); Wenhui Li, Guangdong (CN); Longqiang Shi, Guangdong (CN); Chih-yu Su, Guangdong (CN); Chih-yuan Tseng, Guangdong (TW)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 237 days.

(21) Appl. No.: 14/407,865

(22) PCT Filed: Nov. 28, 2014

(86) PCT No.: PCT/CN2014/092504
§ 371 (c)(1),
(2) Date: Dec. 12, 2014

(87) PCT Pub. No.: WO2016/078112
PCT Pub. Date: May 26, 2016

(65) Prior Publication Data
US 2016/0351601 A1    Dec. 1, 2016

(30) Foreign Application Priority Data
Nov. 21, 2014  (CN) .......................... 2014 1 0677405

(51) Int. Cl.
*H01L 21/16* (2006.01)
*H01L 27/12* (2006.01)
(Continued)

(52) U.S. Cl.
CPC .......... *H01L 27/1262* (2013.01); *C23C 30/00* (2013.01); *H01L 21/77* (2013.01); *H01L 27/1225* (2013.01); *H01L 27/1288* (2013.01); *H01L 29/786* (2013.01); *H01L 29/7869* (2013.01); *H01L 2021/775* (2013.01); *H01L 2227/323* (2013.01)

(58) Field of Classification Search
CPC .......... H01L 21/02225; H01L 21/0334; H01L 27/1214; H01L 27/1255; H01L 27/1262; H01L 27/127; H01L 27/1288; H01L 27/13
See application file for complete search history.

(56) References Cited

U.S. PATENT DOCUMENTS

2014/0061635 A1*  3/2014  Liu .................. H01L 29/66765
                                                          257/43
2014/0097439 A1*  4/2014  Jeon ...................... H01L 27/124
                                                          257/71

* cited by examiner

*Primary Examiner* — Zandra Smith
*Assistant Examiner* — Evan Clinton
(74) *Attorney, Agent, or Firm* — Andrew C. Cheng

(57) ABSTRACT

A manufacturing method and a manufacturing equipment of a thin film transistor substrate are provided. In the manufacturing method, after forming a gate and a gate insulating layer of a thin film transistor, a semiconductor layer and a first protection layer are sequentially deposited. After patterning the first protection layer, the patterned first protection layer is used as a mask to pattern the semiconductor layer to form a semiconductor channel of the thin film transistor. By the above solution, the invention can reduce the number of mask and therefore is beneficial to reduce the cost.

13 Claims, 8 Drawing Sheets

(51) Int. Cl.
*H01L 21/77* (2006.01)
*H01L 29/786* (2006.01)
*C23C 30/00* (2006.01)

MANUFACTURING METHOD AND MANUFACTURING EQUIPMENT OF THIN FILM TRANSISTOR SUBSTRATE

TECHNICAL FIELD

The present invention relates to the field of display technology, and particularly to a manufacturing method and a manufacturing equipment of a thin film transistor substrate.

DESCRIPTION OF RELATED ART

At present, display devices are primarily classified into liquid crystal display (LCD) device and organic light-emitting diode (OLED) display device. A main difference between the two kinds of display devices is that the LCD device needs backlight source illumination for displaying while the OLED display device is self-emissive. Compared with the LCD device, the OLED display device has the advantages of wide viewing angle, fast response, slimmer and more efficient in power saving, and will be the mainstream of next generation display technology following the LCD display technology.

Either the LCD device or the OLED display device generally is driven by using thin film transistors (TFTs). The oxide-semiconductor TFT has high mobility and meanwhile is an amorphous structure and thus has a high compatibility with the current α-Si process, and therefore is widely used in large-sized display panels. Currently, a commonly used structure of the oxide semiconductor TFT is an etching stop layer (ESL) structure. The etching stop layer structure has the advantage of simple to manufacture and high device stability, but requires more number of masks in its manufacturing process and the process is complex.

When the OLED display device is taken as an example, as shown in FIG. 1, during a process of manufacturing oxide semiconductor TFTs with etching stop layer structure, in step S101, a first metal layer 11 is deposited on a substrate 10 and a first mask is used to pattern the first metal layer 11 to thereby form gates of thin film transistors. In step S102, an insulating layer 12 is deposited on the gates and a second mask is used to pattern the insulating layer 12 to thereby form a gate insulating layer of the thin film transistors. In step S103, a semiconductor layer 13 is deposited on the gate insulating layer and a third mask is used to pattern the semiconductor layer 13 to thereby form semiconductor channels of the thin film transistors. In step S104, a first protection layer 14 is deposited on the semiconductor channels and a fourth mask is used to pattern the first protection layer 14. In step S105, a second metal layer 15 is deposited on the semiconductor channels and a fifth mask is used to pattern the second metal layer 15 to thereby form sources and drains of the thin film transistors. In addition, in step S106, masks are needed to form a second protection layer 16 and a pixel electrode layer 17 respectively. Accordingly, in the process of forming the gates, the gate insulating layer, the semiconductor channels, the first protection layer and the sources and drains of the thin film transistors, at least five masks are needed, the number/amount of the masks is excessive, the process is complex and therefore goes against the reduction of cost.

SUMMARY

A technical problem mainly to be solved by the invention is to provide a manufacturing method and a manufacturing equipment of a thin film transistor substrate, which is capable of reducing the number of masks and reducing the complexity of process.

In order to solve the above technical problem, a technical solution adopted by the invention is to provide a manufacturing method of a thin film transistor substrate. The thin film transistor substrate is used for an OLED (organic light emitting diode) display panel. The manufacturing method includes steps of: sequentially depositing and patterning a first metal layer and an insulating layer on a substrate, to form gates and a gate insulating layer of thin film transistors; sequentially depositing a semiconductor layer and a first protection layer on the gate insulating layer, wherein the first protection layer is an etch-stopper layer and a material thereof is silicon nitride; patterning the first protection layer to remove a part of the first protection layer and at least remain the first protection layer covering the semiconductor layer of forming semiconductor channels of the thin film transistors, wherein in the first protection layer covering the semiconductor layer of forming the semiconductor channels, a thickness of the first protection layer covering the semiconductor layer of forming portions of the semiconductor channels contacted with sources and drains of the thin film transistors is smaller than a thickness of the first protection layer covering the semiconductor layer of forming the other of the semiconductor channels; using the patterned first protection layer as a mask to pattern the semiconductor layer to thereby remove the semiconductor layer uncovered by the patterned first protection layer; etching the first protection layer covering the semiconductor layer of forming the semiconductor channels to remove the first protection layer covering the semiconductor layer of forming the portions of the semiconductor channels contacted with the sources and the drains and thereby to expose the semiconductor layer of forming the portions of the semiconductor channels contacted with the sources and the drains; using the etched first protection layer as a mask to perform metallization on the exposed semiconductor layer of forming the portions of the semiconductor channels contacted with the sources and the drains, to form the semiconductor channels of the thin film transistors on the gate insulating layer; depositing and patterning a second metal layer on the semiconductor channels to form the sources and the drains of the thin film transistors. The sources and the drains are contacted with the respective semiconductor channels.

In an exemplary embodiment, a material of the semiconductor layer is indium gallium zinc oxide. The step of patterning the first protection layer includes: patterning the first protection layer to remain the first protection layer on the semiconductor layer of forming a first electrode of a storage capacitor. A thickness of the first protection layer on the semiconductor layer of forming the first electrode of the storage capacitor is smaller than the thickness of the first protection layer covering the semiconductor layer of forming the other of the semiconductor channels. The step of etching the first protection layer covering the semiconductor layer of forming the semiconductor channels further includes: removing the first protection layer on the semiconductor layer of forming the first electrode of the storage capacitor, to expose the semiconductor layer of forming the first electrode of the storage capacitor. The step of using the etched first protection layer as a mask to perform metallization on the exposed semiconductor layer of forming the portions of the semiconductor channels contacted with the sources and the drains further includes: using the etched first protection layer as a mask to perform metallization on the semiconductor layer of forming the first electrode of the storage capacitor, to form the first electrode of the storage capacitor.

In an exemplary embodiment, a thickness of the first protection layer on the semiconductor layer of forming the first electrode of the storage capacitor and the thickness of the first protection layer covering the semiconductor layer of forming the portions of the semiconductor channels contacted with the sources and the drains are the same, and each is a half of the thickness of the first protection layer covering the semiconductor layer of forming the other of the semiconductor channels.

In an exemplary embodiment, after the step of depositing and patterning a second metal layer on the semiconductor channels to form the sources and the drains of the thin film transistors, the manufacturing method further includes: forming a second protection layer on the substrate formed with the sources and the drains; forming a via hole in the second protection layer above one of the drains; and forming a transparent conductive layer on the second protection layer as a second electrode of the storage capacitor and making the transparent conductive layer to be connected with the one of the drains through the via hole.

In order to solve the above technical problem, another technical solution adopted by the invention is to provide a manufacturing method of a thin film transistor substrate. The manufacturing method includes steps of: sequentially depositing and patterning a first metal layer and an insulating layer on a substrate to form a gate and a gate insulating layer of a thin film transistor respectively; sequentially depositing a semiconductor layer and a first protection layer on the gate insulating layer; patterning the first protection layer to remove a part of the first protection layer and at least remain the first protection layer covering the semiconductor layer of forming a semiconductor channel of the thin film transistor; using the patterned first protection layer as a mask to pattern the semiconductor layer to remove the semiconductor layer uncovered by the patterned first protection layer and thereby to form the semiconductor channel of the thin film transistor on the gate insulating layer; depositing and patterning a second metal layer on the semiconductor channel to form a source and a drain of the thin film transistor, wherein the source and the drain are contacted with the semiconductor channel individually.

In an exemplary embodiment, the step of patterning the first protection layer includes: making that in the first protection layer covering the semiconductor layer of forming the semiconductor channel, a thickness of the first protection layer covering the semiconductor layer of forming a portion of the semiconductor channel contacted with the source and the drain is smaller than a thickness of the first protection layer covering the semiconductor layer of forming the other of the semiconductor channel. After using the patterned first protection layer as a mask to pattern the semiconductor layer to remove the semiconductor layer uncovered by the patterned first protection layer, the manufacturing method further includes: etching the first protection layer covering the semiconductor layer of forming the semiconductor channel to remove the first protection covering the semiconductor layer of forming the portion of the semiconductor channel contacted with the source and the drain and thereby to expose the semiconductor layer of forming the portion of the semiconductor channel contacted with the source and the drain; and using the etched first protection layer as a mask to perform metallization on the exposed semiconductor layer of forming the portion of the semiconductor channel contacted with the source and the drain, to form the semiconductor channel of the thin film transistor on the gate insulating layer.

In an exemplary embodiment, a material of the semiconductor layer is indium gallium zinc oxide. The step of patterning the first protection layer includes: patterning the first protection layer to remain the first protection layer on the semiconductor layer of forming a first electrode of a storage capacitor. A thickness of the first protection layer on the semiconductor layer of forming the first electrode of the storage capacitor is smaller than the thickness of the first protection layer covering the semiconductor layer of forming the other of the semiconductor channel. The step of etching the first protection layer covering the semiconductor layer of forming the semiconductor channel further includes: removing the first protection layer on the semiconductor layer of forming the first electrode of the storage capacitor to expose the semiconductor layer of forming the first electrode of the storage capacitor. The step of using the etched first protection layer as a mask to perform metallization on the exposed semiconductor layer of forming the portion of the semiconductor channel contacted with the source and the drain further includes: using the etched first protection layer as a mask to perform metallization on the exposed semiconductor layer of forming the first electrode of the storage capacitor, to form the first electrode of the storage capacitor.

In an exemplary embodiment, a thickness of the first protection layer on the semiconductor layer of forming the first electrode of the storage capacitor and the thickness of the first protection layer covering the semiconductor layer of forming the portion of the semiconductor channel contacted with the source and the drain are the same, and each is a half of the thickness of the first protection layer covering the semiconductor layer of forming the other of the semiconductor channel.

In an exemplary embodiment, after the step of depositing and patterning a second metal layer on the semiconductor channel to form the source and the drain of the thin film transistor, the manufacturing method further includes: forming a second protection layer on the substrate formed with the source and the drain; forming a via hole in the second protection layer directly above the drain; and forming a transparent conductive layer on the second protection layer as a second electrode of the storage capacitor and making the transparent conductive layer to connect with the drain through the via hole.

In order to solve the above technical problem, still another technical solution adopted by the invention is to provide a manufacturing equipment of a thin film transistor substrate. The manufacturing equipment includes: a coating mechanism; a first mask, configured (i.e., structured and arranged) for patterning a first metal layer to form a gate of a thin film transistor, after the coating mechanism coating the first metal layer on a substrate; a second mask, configured for patterning an insulating layer to form a gate insulating layer of the thin film transistor, after the coating mechanism coating the insulating layer on the gate; a third mask, configured for patterning a first protection layer to remove a part of the first protection layer and at least remaining the first protection layer covering a semiconductor layer of forming a semiconductor channel of the thin film transistor to thereby use the remained first protection layer as a mask to pattern the semiconductor layer so as to remove the semiconductor layer uncovered by the remained first protection layer and form the semiconductor channel of the thin film transistor on the gate insulating layer, after the coating mechanism sequentially coating the semiconductor layer and the first protection layer on the gate insulating layer; and a fourth mask, configured for pattering a second metal layer to form a source and a drain of the thin film transistor, after the coating mechanism coating the second metal layer on the semiconductor channel. The source and the drain are contacted with the semiconductor channel individually.

In an exemplary embodiment, the third mask is configured for pattering the first protection layer to make that: in the first protection layer covering the semiconductor layer of forming the semiconductor channel, a thickness of the first protection layer covering the semiconductor layer of forming a portion of the semiconductor channel contacted with the source and the drain is smaller than a thickness of the first protection layer covering the semiconductor layer of forming the other of the semiconductor channel. The manufacturing equipment further includes: an etching mechanism, configured for etching the first protection layer covering the semiconductor layer of forming the semiconductor channel to remove the first protection layer covering the semiconductor layer of forming the portion of the semiconductor channel contacted with the source and the drain and to thereby expose the semiconductor layer of forming the portion of the semiconductor channel contacted with the source and the drain; and a metallization mechanism, configured for using the etched first protection layer as a mask to perform metallization on the exposed semiconductor layer of forming the portion of the semiconductor channel contacted with the source and the drain to form the semiconductor channel of the thin film transistor on the gate insulating layer.

In an exemplary embodiment, a material of the semiconductor layer is indium gallium zinc oxide. The third mask further is configured for patterning the first protection layer to remain the first protection layer on the semiconductor layer of forming a first electrode of a storage capacitor. A thickness of the protection layer on the semiconductor layer of forming the first electrode of the storage capacitor is smaller than the thickness of the first protection layer covering the semiconductor layer of forming the other of the semiconductor channel. The etching mechanism further is configured for etching the first protection layer on the semiconductor layer of forming the first electrode of the storage capacitor to remove the first protection layer on the semiconductor layer of forming the first electrode of the storage capacitor and to thereby expose the semiconductor layer of forming the first electrode of the storage capacitor. The metallization mechanism further is configured for using the etched first protection layer as a mask to perform metallization on the exposed semiconductor layer of forming the first electrode of the storage capacitor to form the first electrode of the storage capacitor.

In an exemplary embodiment, a thickness of the first protection layer on the semiconductor layer of forming the first electrode of the storage capacitor and the thickness of the first protection layer covering the semiconductor layer of forming the portion of the semiconductor channel contacted with the source and the drain are the same, and each is a half of the thickness of the first protection layer covering the semiconductor layer of forming the other of the semiconductor channel.

In an exemplary embodiment, the coating mechanism further is configured for coating a second protection layer on the substrate formed with the source and the drain. The manufacturing equipment further includes a fifth mask configured for patterning the second protection layer to form a via hole in the second protection layer directly above the drain. The coating mechanism further is configured for coating a transparent conductive layer on the second protection layer as a second electrode of the storage capacitor and making the transparent conductive layer to connect with the drain through the via hole.

The efficacy of the invention is that: different from the related art, in the manufacturing method of a thin film transistor substrate of the invention, after forming a gate and a gate insulating layer of a thin film transistor, a patterned first protection layer is used as a mask to pattern a semiconductor layer to form a semiconductor channel of the thin film transistor, and therefore there is no need of additional mask of forming the semiconductor channel to perform exposure to the semiconductor layer, the number of the masks can be reduced and is beneficial to reduce the cost and meanwhile can reduce the alignment error and capacitive coupling.

BRIEF DESCRIPTION OF THE DRAWINGS

In order to more clearly illustrate the technical solutions of various embodiments of the present invention, drawings will be used in the description of embodiments will be given a brief description below. Apparently, the drawings in the following description only are some embodiments of the invention, the ordinary skill in the art can obtain other drawings according to these illustrated drawings without creative effort. In the drawings.

DETAILED DESCRIPTION OF EMBODIMENTS

In the following, with reference to accompanying drawings of embodiments of the invention, technical solutions in the embodiments of the invention will be clearly and completely described. Apparently, the embodiments of the invention described below only are a part of embodiments of the invention, but not all embodiments. Based on the described embodiments of the invention, all other embodiments obtained by ordinary skill in the art without creative effort belong to the scope of protection of the invention.

Figure 1:
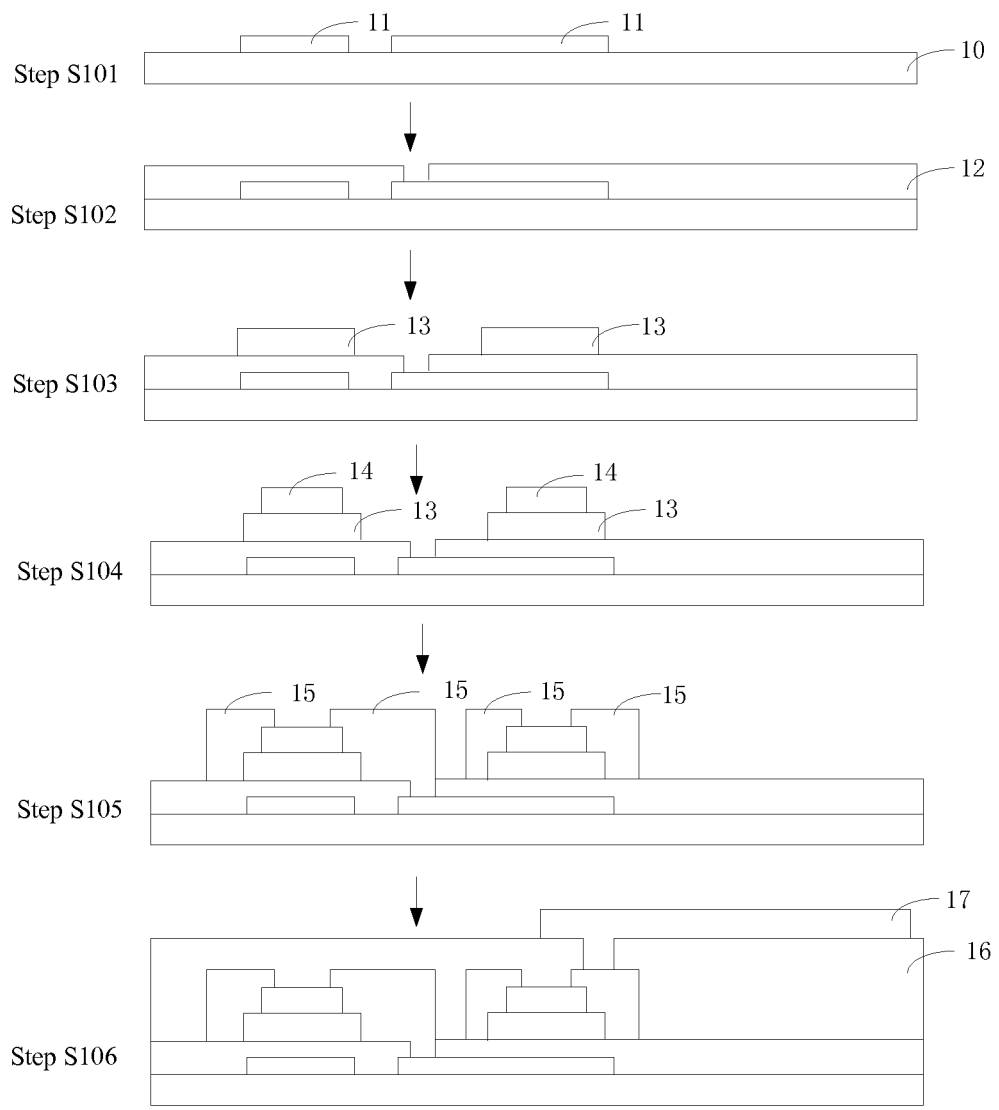
FIG. 1 is a schematic view of a manufacturing method of a thin film transistor substrate in the related art.
Figure 2:
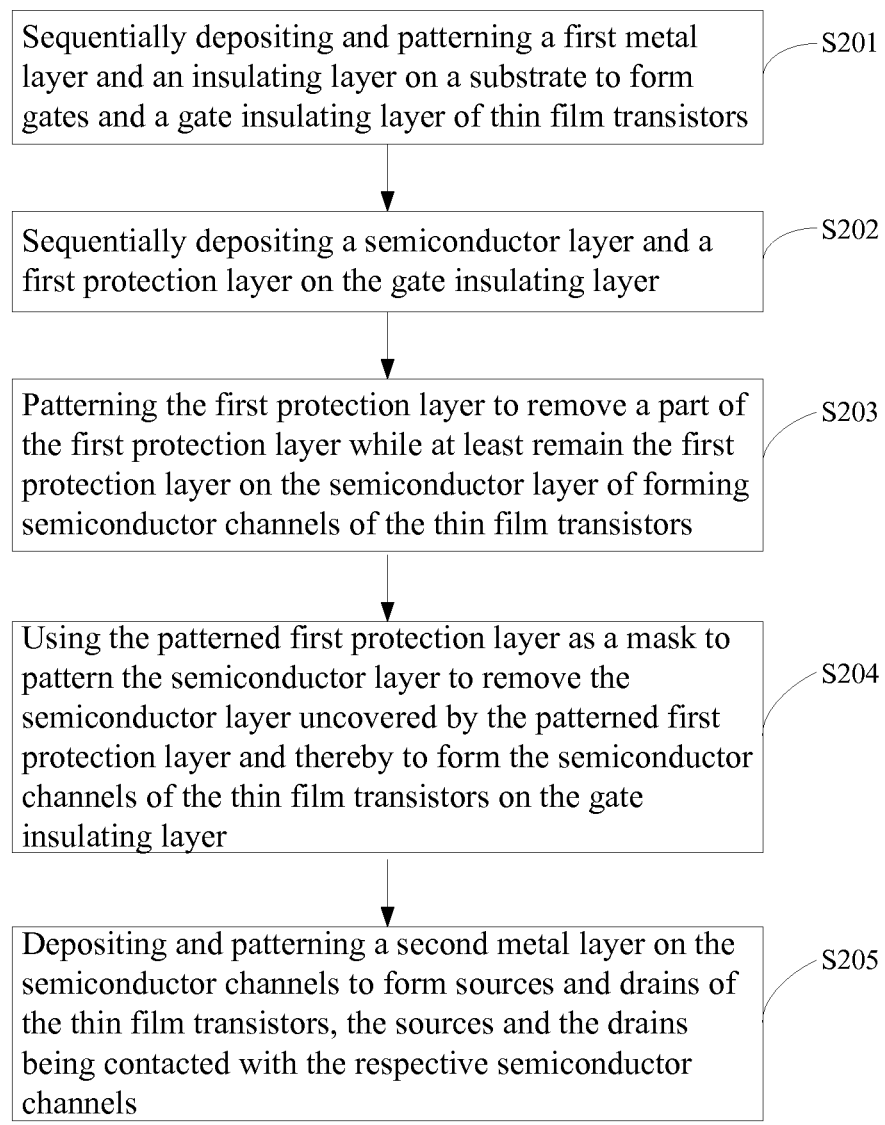
FIG. 2 is a flowchart of an embodiment of a manufacturing method of a thin film transistor substrate of the invention.

Referring to FIG. 2, in an embodiment of a manufacturing method of a thin film transistor substrate, the thin film transistor substrate is a thin film transistor substrate applied to an OLED display panel. Because an OLED is a current driven device, each pixel needs two thin film transistors for driving, one thin film transistor acts as a switching element for switch control, and the other one thin film transistor acts as a driving current provider for light emission of pixel and for controlling the current magnitude of the OLED. Accordingly, in this embodiment, each pixel on the thin film transistor substrate is corresponding to two thin film transistors, and a manufacturing process thereof includes the following steps S201, S202, S203, S204 and S205.

Step S201: sequentially depositing and patterning a first metal layer and an insulating layer on a substrate to respectively form gates and a gate insulating layer of thin film transistors.

Figure 3:
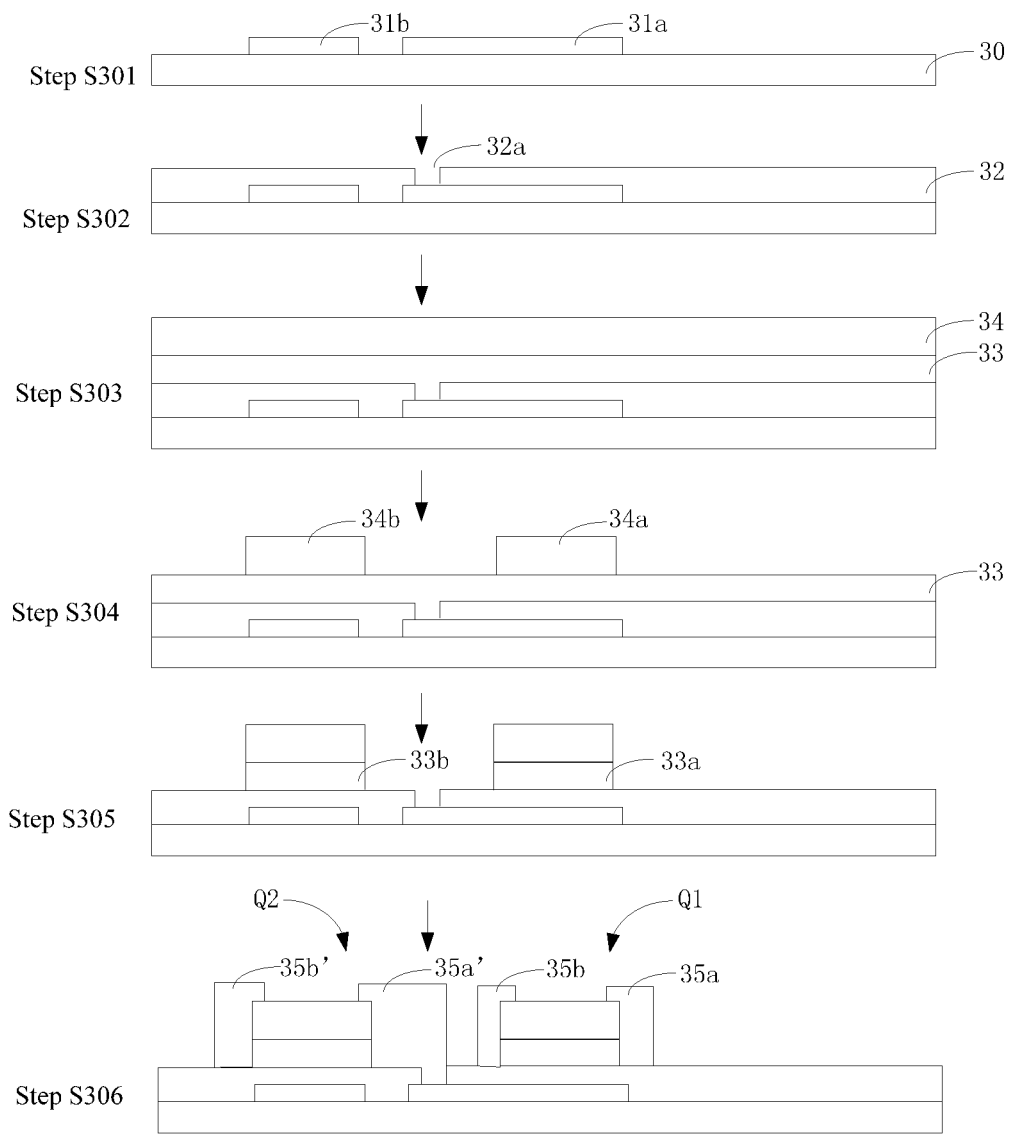
FIG. 3 is a cross-sectional view of an embodiment of a manufacturing method of a thin film transistor substrate of the invention.

In connection with FIG. 3, FIG. 3 is a schematic view of a manufacturing method of a thin film transistor substrate of the invention. As shown in step S301 of FIG. 3, the step is a first mask process. In particular, a first metal layer firstly is deposited on a substrate 30 and then a mask having a gate pattern is used to perform exposure on the first metal layer to thereby form gates 31a, 31b of two thin film transistors. The gate 31a is a gate of a thin film transistor Q1 for controlling an OLED current, and the gate 31b is a gate of a thin film transistor Q2 as a switch. The first metal layer may a copper metal layer.

Step S302 is a second mask process, an insulating layer is deposited on the gates 31a, 31b and a mask having a gate insulating layer pattern is used to perform exposure on the insulating layer to thereby form a gate insulating layer 32 of the thin film transistors Q1, Q2 and a via hole 32a in the gate insulating layer 32 directly above the gate 31a. The gate insulating layer 32 covers the gates 31a, 31b.

Step S202: sequentially depositing a semiconductor layer and a first protection layer on the gate insulating layer.

As shown in step S303 of FIG. 3, a semiconductor layer 33 and a first protection layer 34 are sequentially deposited on the gate insulating layer 32. The semiconductor layer 33 covers the gate insulating layer 32, and the first protection layer 34 covers the semiconductor layer 33. The semiconductor layer 33 is used for forming active layers of the thin film transistors Q1, Q2, i.e., semiconductor channels. The first protection layer 34 is an etch-stopper (ES) layer and concretely may be a silicon nitride material layer or other material layer such as silicon dioxide.

Step S203: patterning the first protection layer to remove a part of the first protection layer and at least remain the first protection layer covering the semiconductor layer of forming semiconductor channels of the thin film transistors.

Corresponding to step S304 as shown in FIG. 3, the step is a third mask process. In this step, a third mask is used to perform exposure on the first protection layer 34 to remove a part of the first protection layer 34 and remain first protection layers 34a, 34b on the semiconductor layer of forming the semiconductor channels of the thin film transistors Q1, Q2. As shown in FIG. 3, except the first protection layers 34a, 34b on the semiconductor layer of forming the semiconductor channels of the thin film transistors Q1, Q2, the other part of the first protection layer 34 is removed.

Step S204: using the patterned first protection layer to pattern the semiconductor layer, to remove the semiconductor layer uncovered by the patterned first protection layer and thereby to form the semiconductor channels of the thin film transistors on the gate insulating layer.

Corresponding to step S305 as shown in FIG. 3, the step S305 is equivalent to a fourth mask process, but no additional mask is needed to perform exposure on the semiconductor layer 33 in this step. In the step S303, after performing exposure on the first protection layer 34, the first protection layers 34a, 34b on the semiconductor layer of forming the semiconductor channels are remained on the substrate, the semiconductor layer 33 is used for forming the semiconductor channels and thus only the semiconductor layer of forming the semiconductor channels on the substrate is remained. Accordingly, in this embodiment, the remained first protection layers 34a, 34b are used as a self-aligned mask to perform exposure on the semiconductor layer 33, so as to remove the semiconductor layer 33 uncovered by the first protection layer 34 while remain the semiconductor layer 33 covered by the first protection layers 34a, 34b and thereby the semiconductor channels 33a, 33b of the two thin film transistors Q1, Q2 are formed. The first protection layers 34a, 34b are an etch-stopper layer, for example are a silicon nitride layer, used for protecting the semiconductor channels 33a, 33b and preventing the semiconductor channels 33a, 33b from corrosion and depression and further improving the breakdown voltage and device reliability.

Step S205: depositing and patterning a second metal layer on the semiconductor channels to form sources and drains of the thin film transistors, the sources and the drains being contacted with the respective semiconductor channels.

Corresponding to step S306 as shown in FIG. 3, a mask having a source and drain pattern is used to perform exposure on a second metal layer to form a source 35b and a drain 35a of the thin film transistor Q1 as well as a source 35b' and a drain 35a' of the thin film transistor Q2. The source 35b and the drain 35a are contacted with the semiconductor channel 33a of the corresponding thin film transistor Q1. The source 35b' and the drain 35a' are contacted with the semiconductor channel 33b of the corresponding thin film transistor Q2. Moreover, the drain 35a' of the thin film transistor Q2 as a switch is connected to the gate 31a of the thin film transistor Q1 for controlling the OLED current through the via hole 32a. By the effect of the semiconductor channels 33a, 33b, the source and the drain of each of the two thin film transistors can be electrically connected or be electrically insulated.

In the related art, during the process of forming the thin film transistors, a mask firstly is used to form the semiconductor channels, an etch-stopper layer then is deposited on the semiconductor channels and another mask is used to perform exposure on the etch-stopper layer, the processes of forming the gates, the gate insulating layer, the semiconductor channels, the etch-stopper layer and the sources and the drains in the related art require five masks in total, and therefore the number of the masks is excessive. Compared with the related art, in this embodiment, during forming the semiconductor channels, the patterned first protection layers 34a, 34b are used as a self-aligned mask to perform exposure on the semiconductor layer 33 to form the semiconductor channels 33a, 33b, and therefore no additional mask for performing exposure on the semiconductor layer is needed, the additional mask for the semiconductor layer is omitted. As a result, the number of the masks is reduced, which is in favor of reducing the cost and meanwhile can reduce mask alignment error and capacitive coupling.

Figure 4:
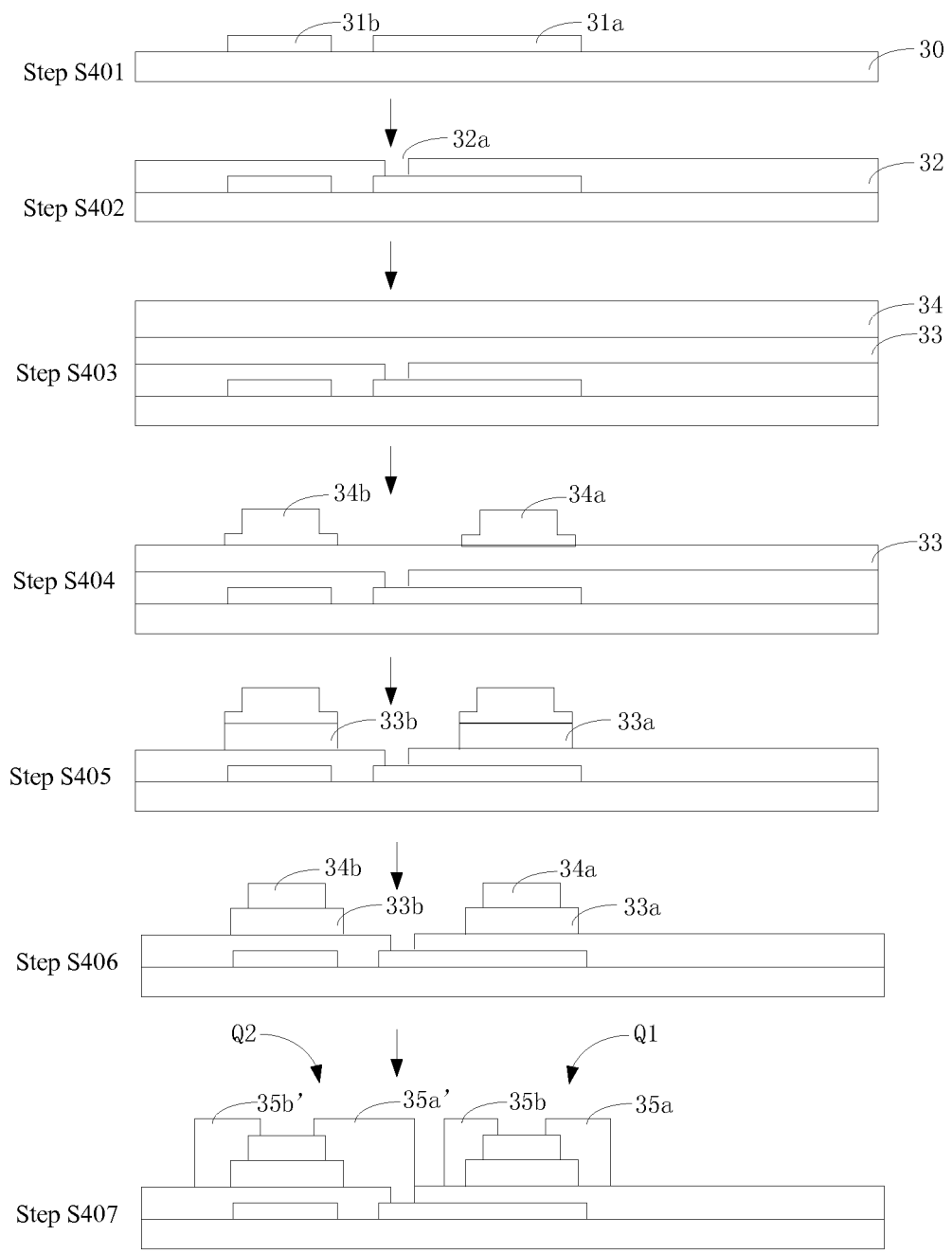
FIG. 4 is a cross-sectional view of another embodiment of a manufacturing method of a thin film transistor substrate of the invention.

In the above described embodiment, the sources 35b, 35b' and the drains 35a, 35a' are contacted with side surfaces of respective semiconductor channels 33a, 33b. In order to increase the reliability of the contacts between the semiconductor channels and the sources and drains, in another embodiment of a manufacturing method of a thin film transistor substrate of the invention, a half-tone mask technique is used to pattern the first protection layer 34, so as to increase contact areas of the sources and drains with respective semiconductor channels. Referring to FIG. 4, same steps S401~S403 may be carried out referring to the above described embodiment, and thus will not be repeated herein. In this embodiment, the sources 35b, 35b' and the drains 35a, 35a' are made to contact with top surfaces of respective semiconductor channels 33a, 33b adjacent to the first protection layers 34a, 34b, so as to increase the contact areas. Specifically, in step S404, a half-tone mask is used as the third mask to perform exposure on the first protection layer 34 to make that: in the remained first protection layers 34a, 34b on the semiconductor layer 33 of forming the semiconductor channels, a thickness of the first protection layer covering the semiconductor layer of forming portions of the semiconductor channels contacted with the sources 35b, 35b' and the drains 35a, 35a' is smaller than a thickness of the first protection layer covering the semiconductor layer of forming the other portion of the semiconductor channels. Furthermore, during performing exposure on the first protection layer 34, in the remained first protection layers 34a, 34b on the semiconductor layer 33 of forming the semiconductor channels, the middle portion of the first protection layer 34 is non-exposure, the remained thickness is the thickest, two ends of the first protection layer 34 is a certain level of exposure to remove a part of thickness of the first protection layer so as to remain the first protection layer with a certain thickness on the semiconductor layer 33. The two ends of the first protection layer are the first protection layer covering the semiconductor layer of forming the portions of the semiconductor channels contacted with the sources 35b, 35b' and the drains 35a, 35a', and positions thereof on the semiconductor layer 33 are contact positions of the sources and drains with the top surfaces of respective semiconductor channels.

Subsequently, in step S405, the patterned first protection layers 34a, 34b are used as a mask to perform exposure on the semiconductor layer 33, so as to remove the semiconductor layer uncovered by the patterned first protection layers 34a, 34b while remain the semiconductor layer covered by the patterned first protection layers 34a, 34b. The remained semiconductor layer forms the semiconductor channels 33a, 33b. In step S406, the first protection layers 34a, 34b covering the semiconductor layer of forming the semiconductor channels are etched to remove the first protection layer covering the semiconductor layer of forming portions of the semiconductor channels contacted with the sources 35b, 35b' and drains 35a, 35a' and thereby to expose the semiconductor layer of forming the portions of the semiconductor channels contacted with the sources 35b, 35b' and drains 35a, 35a'. Because the thickness of the first protection layer covering the semiconductor layer of forming the portions of the semiconductor channels contacted with the sources 35b, 35b' and drains 35a, 35a' is smaller than the thickness of the middle portions of the first protection layers, when etching the first protection layers 34a, 34b on the respective semiconductor channels 33a, 33b, by controlling the etching condition, the two ends with smaller thickness of the first protection layers can be completely removed, and the two ends of each semiconductor channel are exposed, while the middle portions with thicker thickness of the first protection layers only are removed a part of thickness, and the removed thickness is substantially the same as that of the removed two ends of the first protection layer with the smaller thickness. Accordingly, the middle portions of the first protection layers still are partially remained on the respective semiconductor channels 33a, 33b, so as to protect the semiconductor channels 33a, 33b.

In step S407, a second metal layer is deposited and patterned on the semiconductor channels 33a, 33b to form the sources 35b, 35b' and the drains 35a, 35a'. In the thin film transistor Q1, the first protection layer 34a is located between the source 35b and the drain 35a, the source 35b and the drain 35a both are contacted with the top surface of the semiconductor channel 33a adjacent to the first protection layer 34a. In the thin film transistor Q2, the first protection layer 34b is located between the source 35b' and the drain 35a', the source 35b' and the drain 35b' both are contacted with the top surface of the semiconductor channel 33b adjacent to the first protection layer 34b. Accordingly, the contact areas may be increased and it is beneficial to improve the device reliability.

In an embodiment of a manufacturing method of a thin film transistor of the invention, the semiconductor layer is an amorphous IGZO (indium gallium zinc oxide) material layer, which can improve the carrier mobility and thereby can greatly improve the charge-discharge rate of pixel electrode. Of course, in other embodiment, the semiconductor layer may be an amorphous silicon material layer.

Figure 5:
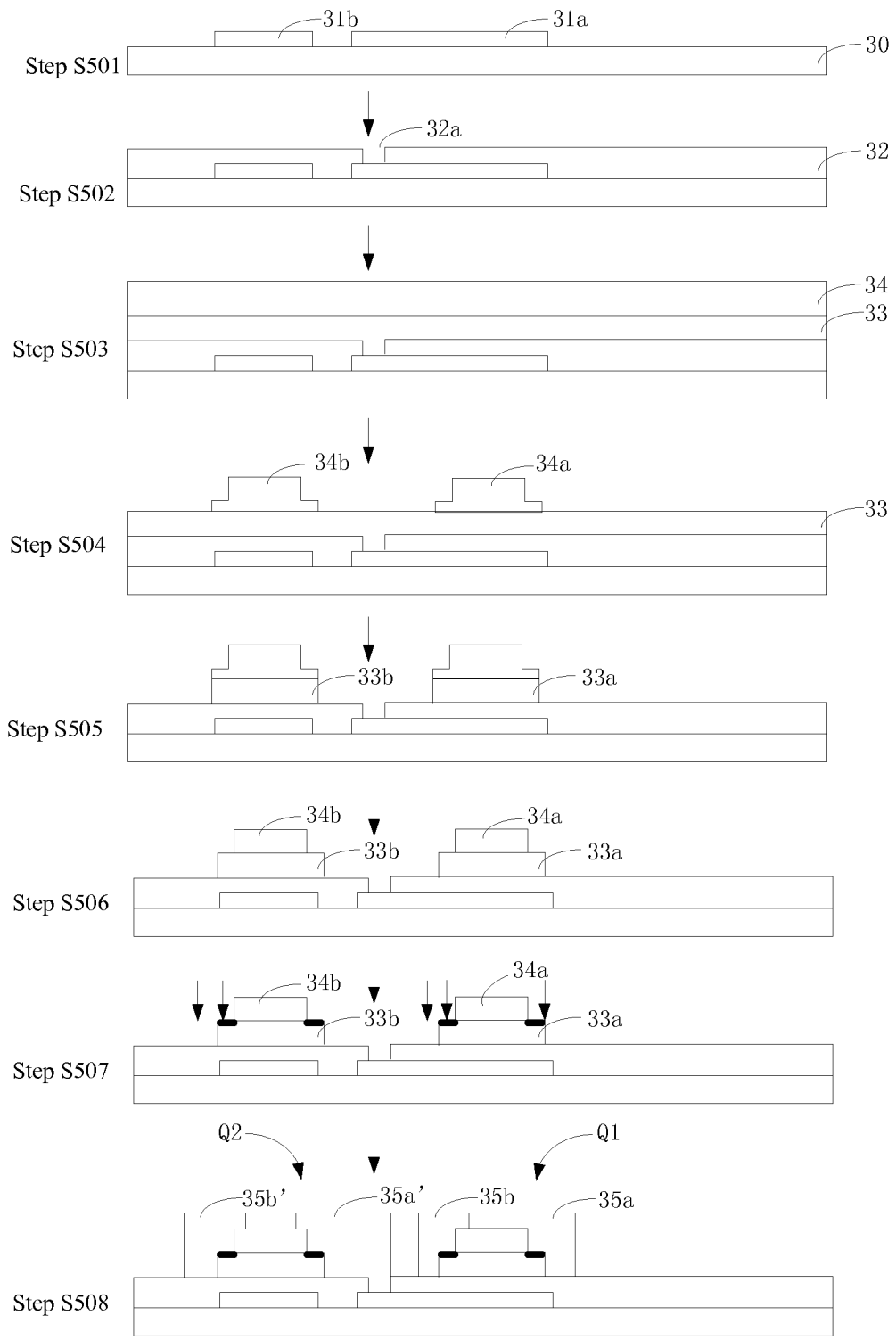
FIG. 5 is a cross-sectional view of still another embodiment of a manufacturing method of a thin film transistor substrate of the invention.

When using the amorphous IGZO material to form the semiconductor layer, since there is the existence of potential barrier at the contact position of the oxide semiconductor and a metal material, which would affect the electron transmission of device. Accordingly, in still another embodiment of a manufacturing method of a thin film transistor substrate of the invention, as shown in FIG. 5, what is difference from the embodiment as shown in FIG. 4 is that: a metallization process is added, i.e., step S507 as shown in FIG. 5. In step S506, the first protection layers 34a, 34b are etched to remove the first protection layer covering the semiconductor layer of forming the portions of the semiconductor channels contacted with the sources 35b, 35b' and drains 35a, 35a', and thereafter goes to step S507, i.e., using the etched first protection layers 34a, 34b as a mask to perform metallization on the exposed semiconductor layer of forming the portions of the semiconductor channels contacted with the sources 35b, 35b' and drains 35a, 35a', and thereby forming the semiconductor channels 33a, 33b. After performing metallization on the exposed portions of the semiconductor channels, a second metal layer is deposited and patterned to form the sources and the drains. The sources and drains are contacted with the semiconductor layer after the metallization.

By performing metallization on the semiconductor layer, resistances at the contact positions of the semiconductor channels with the respective sources 35b, 35b' and drains 35a, 35a' can be reduced, and the device performance is further improved. In addition, in this embodiment, the etched first protection layers 34a, 34b are used as a self-aligned mask to perform metallization on the semiconductor layer, and thus no additional mask is needed for the metallization. Compared with the solution of additionally adding a mask for metallization, the number of the masks is reduced and it is beneficial to reduce the manufacturing cost.

In the manufacturing process of the thin film transistors, a storage capacitor generally is provided for keeping a potential level, so that the display panel can normally display. In the related art, the storage capacitor is manufactured as a structure of metal electrodes sandwitched with an insulating layer therebetween. However, the metal is an opaque material, resulting in reduced aperture ratio of the panel. In an embodiment of a manufacturing method of a thin film transistor substrate of the invention, the transparent IGZO is used to form the semiconductor layer and an electrode of the storage capacitor, so as to increase the aperture ratio. In particular, referring to FIG. 6, step S601 is for forming the gates 31a, 31b, step S602 is for forming the gate insulating layer 32, step S603 is for sequentially depositing the semiconductor layer 33 and the first protection layer 34.

In step S604, the first protection layer 34 is patterned. Specifically, a half-tone mask is used to perform exposure on the first protection layer 34 to remove a part of the first protection layer while remain the first protection layer on the semiconductor layer of forming a first electrode of a storage capacitor besides the first protection layer on the semiconductor layer of forming the semiconductor channels. The first protection layer covering the semiconductor layer which will be completely removed in subsequent process is full exposure, the first protection layer covering the semiconductor layer of forming portions of the semiconductor channels contacted with the sources and drains and the first protection layer on the semiconductor layer of forming the first electrode of the storage capacitor in subsequent process are partial exposure, the first protection layer covering the semiconductor layer of forming protected semiconductor channels in subsequent process is non-exposure. Herein, the semiconductor layer of forming the protected semiconductor channels is the other portion of the semiconductor layer in the semiconductor layer of forming semiconductor channels except the semiconductor layer of forming the portions of the semiconductor channels contacted with the sources and drains. After the above exposure, the first protection layer of full exposure is completely removed to expose corresponding semiconductor layer, the first protection layer of non-exposure is kept at its original thickness, the first protection layer of partial exposure is removed a part thereof and a certain thickness of first protection layer is remained, a thickness of the first protection layer with the certain thickness is smaller than a thickness of the first protection layer of non-exposure.

Figure 6:
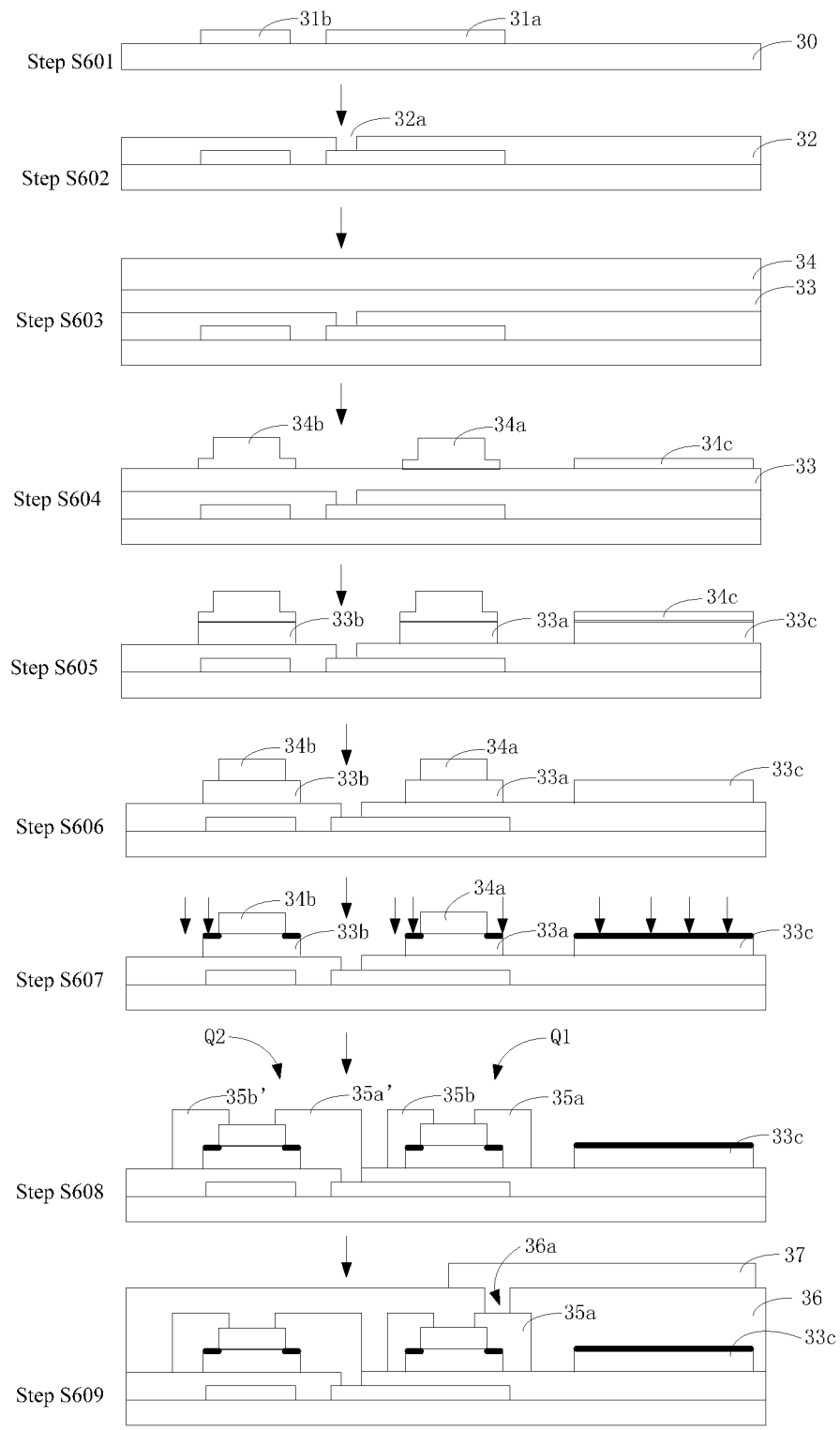
FIG. 6 is a cross-sectional view of even still another embodiment of a manufacturing method of a thin film transistor substrate of the invention.

Accordingly, as shown in step S604 of FIG. 6, a pattern of the first protection layer after exposure includes stepwise first protection layers 34a, 34b on the semiconductor layer 33 of forming the semiconductor channels and a first protection layer 34c on the semiconductor layer 33 of forming the first electrode of the storage capacitor. In the stepwise first protection layers 34a, 34b, the first protection layer with smaller thickness is the first protection layer covering the semiconductor layer of forming the portion of the semiconductor channels contacted with the sources and drains.

Furthermore, in order to better control the exposure condition, in this embodiment, the first protection layer of partial exposure is semi-exposure, so as to remove a half of thickness of the first protection layer, so that a thickness of the first protection layer covering the semiconductor layer of forming the portions of the semiconductor channels contacted with the sources and drains and a thickness of the first protection layer covering the semiconductor layer of forming the first electrode of the storage capacitor each is a half of the thickness of the first protection layer of non-exposure, i.e., the thickness of the first protection layer with the certain thickness is a half of its original thickness. Of course, in other embodiment, the thickness of the first protection layer covering the semiconductor layer of forming the portions of the semiconductor channels contacts with the sources and drains and the thickness of the first protection layer covering the semiconductor layer of forming the first electrode of the storage capacitor may be different from each other, and the thickness is not limited to be a half of its original thickness and can be set according to actual requirement, as long as it is smaller than the thickness of the first protection layer of non-exposure and can ensure complete blocking of the semiconductor layer of forming the semiconductor channels.

In step S605, the first protection layers 34a, 34b, 34c after exposure are used as a mask to perform exposure on the semiconductor layer 33, so as to remove the semiconductor layer uncovered by the first protection layers 34a, 34b, 34c while remain the semiconductor layer covered by the first protection layers 34a, 34b, 34c, and thereby to form the semiconductor channels and the first electrode of the storage capacitor.

In step S606, the first protection layers 34a, 34b, 34c are etched to remove the first protection layers 34a, 34b covering the semiconductor layer of forming the portions of the semiconductor channels contacted with the sources and drains and to remove the first protection layer 34c covering the semiconductor layer of forming the first electrode of the storage capacitor, and thereby to expose the semiconductor layer of forming the portions of the semiconductor channels contacted with the sources and drains and the semiconductor layer of forming the first electrode of the storage capacitor. Because the thickness of the first protection layers 34a, 34b covering the semiconductor layer of forming the protected semiconductor channels is larger than the thickness of the other first protection layer, by controlling the etching condition, after the other first protection layer with smaller thickness is etched off, the first protection layers 34a, 34b covering the semiconductor layer of forming the protected semiconductor channels still are partially remained on the semiconductor channels so as to protect the semiconductor channels.

In step S607, the etched first protection layers 34a, 34b are used as a mask to perform metallization on the exposed semiconductor layer so as to form the semiconductor channel 33a of the thin film transistor Q1, the semiconductor channel 33b of the thin film transistor Q2 and the first electrode 33c of the storage capacitor. The metallization performed on the semiconductor layer can be achieved by H diffusion, ion implantation or plasma treatment, and so on.

In step S608, a second metal layer is deposited and patterned on the semiconductor channels 33a, 33b to form the source 35b and drain 35a of the thin film transistor Q1 and the source 35b' and drain 35a' of the thin film transistor Q2.

Furthermore, in this embodiment, after forming the sources 35b, 35b' and the drains 35a, 35a', in the step S608, a second protection layer 36 is formed on the substrate formed with the sources 35b, 35b' and the drains 35a, 35a', and a mask is used to pattern the second protection layer 36 to form a via hole 36a in the second protection layer 36 directly above the drain 35a of the thin film transistor Q1. The second protection layer is an insulating layer or a passivation layer, and may be made of silicon dioxide material. Thereafter, a transparent conductive layer 37 is formed on the second protection layer 36. The transparent conductive layer 37 is used for forming a pixel electrode and connected with the drain 35a of the thin film transistor Q1 through the via hole 36a. In addition, the transparent conductive layer 37 is also used as a second electrode of the storage capacitor and forms the storage capacitor together with the first electrode 33c by sandwiching the second protection layer 36 therebetween.

In this embodiment, by using the patterned first protection layers 34a, 34b, 34c as a self-aligned mask to perform exposure on the semiconductor layer 33, which can omit an additional mask for exposure on the semiconductor layer 33 and meanwhile can reduce the alignment error and capacitive coupling. By using the etched first protection layers 34a, 34b as a mask to perform metallization, which can further omit an additional mask for metallization and thus is beneficial to reduce the cost. In addition, by performing metallization on portions of the semiconductor channels contacted with the sources and drains, which can reduce the resistances at the contact positions of the sources and drains with the respective semiconductor channels and is beneficial to increase the electron transmission. Moreover, the storage capacitor is formed by the transparent IGZO semiconductor layer and the transparent conductive layer, compared with the conventional storage capacitor formed with opaque metal, it is beneficial to increase the aperture ratio.

In even still another embodiment of a manufacturing method of a thin film transistor substrate of the invention, the thin film transistor substrate may be used as an array substrate of a liquid crystal display panel, and a difference from the above embodiment used for the thin film transistor substrate of OLED is that: the number/amount of thin film transistor in the substrate is one, i.e., the thin film transistor Q2 used as a switch, and at this situation the transparent conductive layer for forming the pixel electrode is connected with the drain of the thin film transistor Q2. A specific manufacturing process thereof is similar to that in above described various embodiments, and thus will not be repeated herein.

The invention further provides an embodiment of a thin film transistor substrate. The thin film transistor substrate is manufactured by the manufacturing method of a thin film transistor in any one of the above embodiments. In particular, the thin film transistor substrate includes a storage capacitor. A first electrode of the storage capacitor is made of indium gallium zinc oxide, and a second electrode of the storage capacitor is formed by a transparent conductive layer as a pixel electrode.

Figure 7:
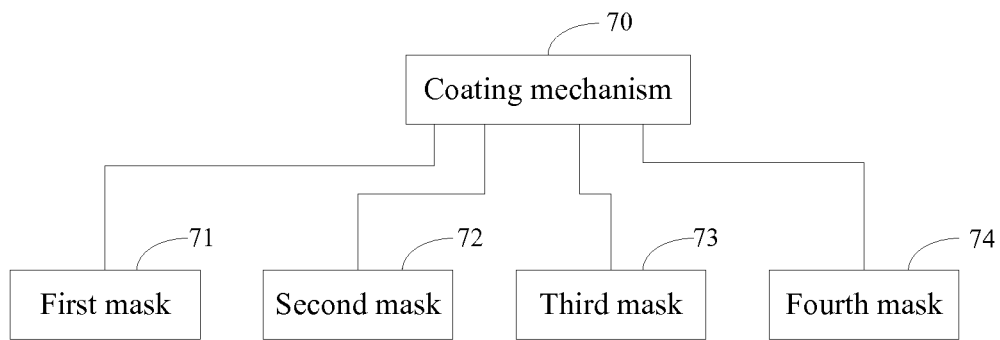
FIG. 7 is a schematic structural view of an embodiment of a manufacturing equipment of a thin film transistor substrate of the invention.

Referring to FIG. 7, in an embodiment of a manufacturing equipment of a thin film transistor substrate of the invention, the manufacturing equipment includes a coating mechanism 70, a first mask 71, a second mask 72, a third mask 73 and a fourth mask 74. The coating mechanism 70 is configured for coating a first metal layer, an insulating layer, a semiconductor layer, a first protection layer and a second metal layer. The first mask 71 is configured for patterning the first metal layer to form a gate of a thin film transistor, after the coating mechanism 70 coating the first metal layer on a substrate. The second mask 72 is configured for patterning the insulating layer to form a gate insulating layer of the thin film transistor, after the coating mechanism coating the insulating layer on the gate. The third mask 73 is configured for patterning the first protection layer to remove a part of the first protection layer while at least remain the first protection layer on the semiconductor layer of forming a semiconductor channel of the thin film transistor, and thereby to use the remained first protection layer as a mask to pattern the semiconductor layer for removing the semiconductor layer uncovered by the remained first protection layer and thereby forming the semiconductor channel of the thin film transistor on the gate insulating layer, after the coating mechanism 70 sequentially coating the semiconductor layer and the first protection layer on the gate insulating layer. The first protection layer is an etch-stopper (ES) layer. The fourth mask 74 is configured for patterning the second metal layer to form a source and a drain of the thin film transistor, after the coating mechanism 70 coating the second metal layer on the semiconductor channel. The source and the drain are contacted with the semiconductor channel individually.

By the above solution, in the processes of forming the gate, the gate insulating layer, the semiconductor channel, the first protection layer and the source and drain, compared with the related art requiring five masks, this embodiment uses the patterned first protection layer as a self-aligned mask to pattern the semiconductor layer, and therefore only four masks are required to finish the above processes, the number of the masks is reduced and meanwhile the alignment error and capacitive coupling also can be reduced.

Figure 8:
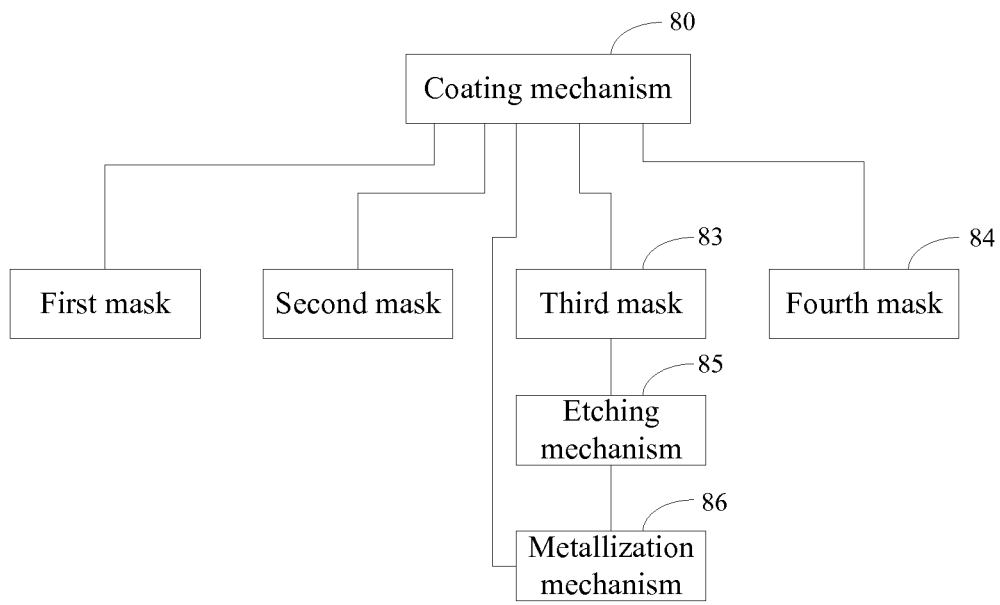
FIG. 8 is a schematic structural view of another embodiment of a manufacturing equipment of a thin film transistor substrate of the invention.

In another embodiment of a manufacturing equipment of a thin film transistor substrate of the invention, as shown in FIG. 8, what is difference from the above embodiment of the manufacturing equipment is that: the manufacturing equipment further includes an etching mechanism 85 and a metallization mechanism 86. The third mask 83 is configured for patterning the first protection layer to make that: in the remained first protection layer on the semiconductor layer of forming the semiconductor channel, a thickness of the first protection layer covering the semiconductor layer of forming a portion of the semiconductor channel contacted with the source and the drain is smaller than a thickness of the first protection layer covering the semiconductor layer of forming the other portion of the semiconductor channel. After using the patterned first protection layer to pattern the semiconductor layer to remove the semiconductor layer uncovered by the first protection layer, the etching mechanism 85 is used for etching the first protection layer covering the semiconductor layer of forming the semiconductor channel to remove the first protection layer covering the semiconductor layer of forming the portion of the semiconductor channel contacted with the source and the drain and thereby to expose the semiconductor layer of forming the portion of the semiconductor channel contacted with the source and the drain. The metallization mechanism 86 is used for using the etched first protection layer as a mask to perform metallization on the exposed semiconductor layer of forming the portion of the semiconductor channel contacted with the source and the drain and thereby to form the semiconductor channel of the thin film transistor on the gate insulating layer. After performing metallization on the exposed semiconductor layer, the coating mechanism 80 is used for coating the second metal layer on the semiconductor channel, and the fourth mask 84 is used for patterning the second metal layer to form the source and the drain. The source and the drain are contacted with the semiconductor layer after the metallization. By the metallization on the semiconductor layer, resistances at the contact position of the semiconductor channel with the source and the drain can be reduced, which is beneficial to increase the electron transmission efficiency.

Figure 9:
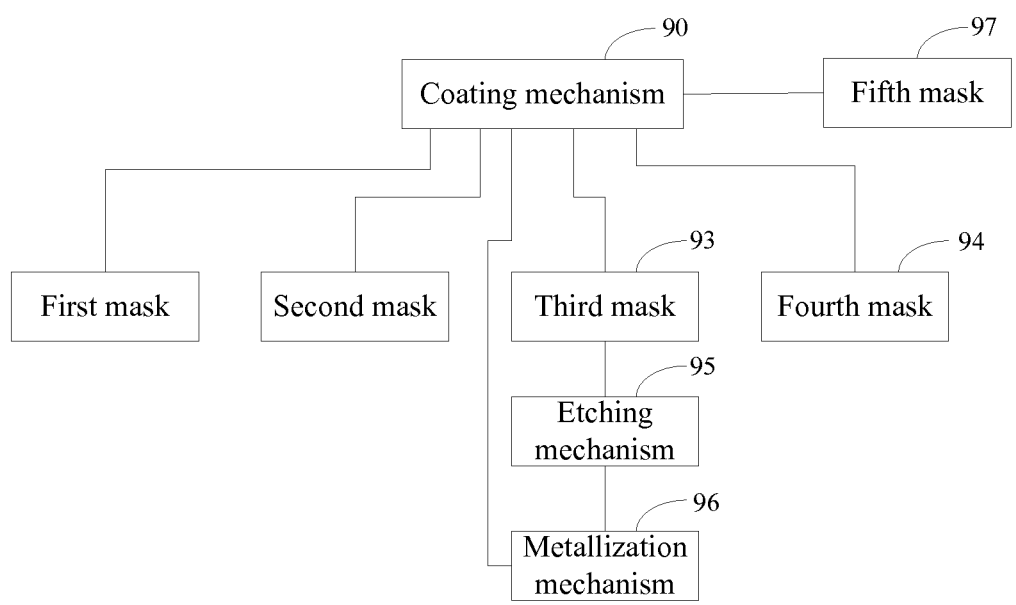
FIG. 9 is a schematic structural view of still another embodiment of a manufacturing equipment of a thin film transistor substrate of the invention.

In still another embodiment of a manufacturing equipment of a thin film transistor substrate, the thin film transistor substrate further is formed with a storage capacitor. In particular, in this embodiment, a material of the semiconductor layer is indium gallium zinc oxide, the use of semiconductor layer to form the storage capacitor can increase the aperture ratio. Referring to FIG. 9, what is difference from the above embodiments is that: during using a third mask 93 to pattern the first protection layer, the protection layer on the semiconductor layer of forming a first electrode of the storage capacitor also is remained besides the first protection layer on the semiconductor layer of forming the semiconductor channel. In detail, the first protection layer covering the semiconductor layer which will be completely removed in subsequent process is full exposure, the first protection layer covering the semiconductor layer of forming the portion of the semiconductor channel contacted with the source and the drain and the first protection layer covering the semiconductor of forming the first electrode of the storage capacitor in subsequent process are partial exposure, and the first protection layer covering the semiconductor layer of forming the protected semiconductor channel is non-exposure. Herein, the semiconductor layer of forming the protected semiconductor channel is the semiconductor layer of forming the other portion of the semiconductor channel in the semiconductor layer of forming the semiconductor channel except for the semiconductor layer of forming the portion of the semiconductor channel contacted with the source and the drain. After the above exposure, the first protection layer of full exposure is completely removed to expose corresponding semiconductor layer, the first protection layer of non-exposure keeps its original thickness, the first protection layer of partial exposure is removed a part thickness thereof to thereby remain the first protection layer with reduced certain thickness. The thickness of the first protection layer with the reduced certain thickness is smaller than the thickness of the first protection layer of non-exposure.

A pattern of the first protection layer after the exposure includes the stepwise first protection layer on the semiconductor layer of forming the semiconductor channel and the first protection layer on the semiconductor layer of forming the first electrode of the storage capacitor. In the stepwise first protection layer, the first protection layer with smaller thickness is the first protection layer covering the semiconductor layer of forming the portion of the semiconductor channel contacted with the source and the drain.

Furthermore, in order to better control the exposure condition, in this embodiment, the first protection layer of partial exposure is semi-exposure to remove a half of thickness of the first protection layer, so that the thickness of the first protection layer covering the semiconductor layer of forming the portion of the semiconductor channel contacted with the source and the drain and the thickness of the first protection layer covering the semiconductor layer of forming the first electrode of the storage capacitor are the same and each is a half of the thickness of the first protection layer of non-exposure, i.e., the thickness of the first protection layer with the reduced certain thickness is a half of the original thickness itself. Of course, in other embodiment, the thickness of the first protection layer covering the semiconductor layer of forming the portion of the semiconductor channel contacted with the source and the drain and the thickness of the first protection layer covering the semiconductor layer of forming the first electrode of the storage capacitor may be different from each other, and each the thickness may be not limited to a half of the original thickness and can be set according to actual requirement, as long as the thickness is smaller than the thickness of the first protection layer of non-exposure and can ensure complete blocking of the remained semiconductor layer.

After using the patterned first protection layer to pattern the semiconductor layer, the etching mechanism 95 is used for etching the first protection layer covering the semiconductor layer of forming the portion of the semiconductor channel contacted with the source and the drain and the first protection layer covering the semiconductor layer of forming the first electrode of the storage capacitor, to remove the first protection layer covering the semiconductor layer of forming the portion of the semiconductor channel contacted with the source and the drain as well as the first protection layer covering the semiconductor layer of forming the first electrode of the storage capacitor and thereby to expose the semiconductor layer of forming the portion of the semiconductor channel contacted with the source and the drain as well as the semiconductor layer of forming the first electrode of the storage capacitor. The metallization mechanism 96 is used for using the etched first protection layer as a mask to perform metallization on the exposed semiconductor layer to thereby form the semiconductor channel of the thin film transistor and the first electrode of the storage capacitor.

After forming the semiconductor channel of the thin film transistor and the first electrode of the storage capacitor, the coating mechanism 90 is used for coating the second metal layer on the semiconductor channel, and the fourth mask 94 is used for patterning the second metal layer to form the source and the drain of the thin film transistor.

In addition, in this embodiment, the manufacturing equipment further includes a fifth mask 97. After forming the source and the drain of the thin film transistor, the coating mechanism 90 is used for coating a second protection layer on the source and the drain. The second protection layer may be an insulating layer or a passivation layer, and may be made of silicon dioxide material. The fifth mask 97 is used for patterning the second protection layer to form a via hole in the second protection layer directly above the drain of the thin film transistor. The coating mechanism 90 further is used for coating a transparent conductive layer on the second protection layer as a second electrode of the storage capacitor and making the transparent conductive layer to connect with the drain through the via hole. The transparent conductive layer also is used as a pixel electrode for achieving display.

In this embodiment, by using the transparent indium gallium zinc oxide and the transparent conductive layer having the second protection layer sandwiched therebetween to form the storage capacitor, compared with the conventional storage capacitor formed by using the opaque metal, the aperture ratio can be increased. Meanwhile, this embodiment uses the patterned first protection layer as a self-aligned mask to perform exposure on the semiconductor layer, which can omit an additional mask for the semiconductor layer and the alignment error and capacitive coupling can be reduced. By using the etched first protection layer as a self-aligned mask to perform metallization on the semiconductor layer, an additional mask for metallization can be omitted and therefore the number of the masks is further reduced.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A manufacturing method of a thin film transistor substrate, the thin film transistor being used for an OLED display panel, the manufacturing method comprising:
   sequentially depositing and patterning a first metal layer and an insulating layer on a substrate, to form gates and a gate insulating layer of thin film transistors;
   sequentially depositing a semiconductor layer and a first protection layer on the gate insulating layer, wherein the first protection layer is an etch-stopper layer and a material thereof is silicon nitride;

patterning the first protection layer to remove a part of the first protection layer and at least remain the first protection layer covering the semiconductor layer which forms semiconductor channels of the thin film transistors, wherein in the first protection layer covering the semiconductor layer which forms the semiconductor channels, a thickness of the first protection layer covering the semiconductor layer which forms portions of the semiconductor channels contacted with sources and drains of the thin film transistors is smaller than a thickness of the first protection layer covering the semiconductor layer which forms the other of the semiconductor channels;

using the patterned first protection layer as a mask to pattern the semiconductor layer to thereby remove the semiconductor layer uncovered by the patterned first protection layer;

etching the first protection layer covering the semiconductor layer which is used to form the semiconductor channels to remove the first protection layer covering the semiconductor layer which forms the portions of the semiconductor channels contacted with the sources and the drains and thereby to expose the semiconductor layer which forms the portions of the semiconductor channels contacted with the sources and the drains;

using the etched first protection layer as a mask to perform metallization on the exposed semiconductor layer which forms the portions of the semiconductor channels contacted with the sources and the drains, to form the semiconductor channels of the thin film transistors on the gate insulating layer;

depositing and patterning a second metal layer on the semiconductor channels to form the sources and the drains of the thin film transistors, wherein the sources and the drains are contacted with the respective semiconductor channels, the drain of one of the thin film transistors is connected with the gate of another of the thin film transistors through a via hole formed in the gate insulating layer; wherein a material of the semiconductor layer is indium gallium zinc oxide;

the step of patterning the first protection layer comprises:
  patterning the first protection layer to remain the first protection layer on the semiconductor layer which forms a first electrode of a storage capacitor, wherein a thickness of the first protection layer on the semiconductor layer which forms the first electrode of the storage capacitor is smaller than the thickness of the first protection layer covering the semiconductor layer which forms the other of the semiconductor channels;

the step of etching the first protection layer covering the semiconductor layer which forms the semiconductor channels further comprises:
  removing the first protection layer on the semiconductor layer which forms the first electrode of the storage capacitor, to expose the semiconductor layer which forms the first electrode of the storage capacitor;

the step of using the etched first protection layer as a mask to perform metallization on the exposed semiconductor layer which forms the portions of the semiconductor channels contacted with the sources and the drains further comprises:
  using the etched first protection layer as a mask to perform metallization on the semiconductor layer which forms the first electrode of the storage capacitor, to form the first electrode of the storage capacitor.

2. The manufacturing method as claimed in claim 1, wherein
  a thickness of the first protection layer on the semiconductor layer which forms the first electrode of the storage capacitor and the thickness of the first protection layer covering the semiconductor layer which forms the portions of the semiconductor channels contacted with the sources and the drains are the same, and each is a half of the thickness of the first protection layer covering the semiconductor layer which forms the other of the semiconductor channels.

3. The manufacturing method as claimed in claim 1, after the step of depositing and patterning a second metal layer on the semiconductor channels to form the sources and the drains of the thin film transistors, further comprising:
  forming a second protection layer on the substrate formed with the sources and the drains;
  forming a via hole in the second protection layer above one of the drains;
  forming a transparent conductive layer on the second protection layer as a second electrode of the storage capacitor and making the transparent conductive layer to be connected with the one of the drains through the via hole.

4. A manufacturing method of a thin film transistor substrate, comprising:
  sequentially depositing and patterning a first metal layer and an insulating layer on a substrate to form a gate and a gate insulating layer of a thin film transistor respectively;
  sequentially depositing a semiconductor layer and a first protection layer on the gate insulating layer;
  patterning the first protection layer to remove a part of the first protection layer and at least remain the first protection layer covering the semiconductor layer which forms a semiconductor channel of the thin film transistor;
  using the patterned first protection layer as a mask to pattern the semiconductor layer to remove the semiconductor layer uncovered by the patterned first protection layer and thereby to form the semiconductor channel of the thin film transistor on the gate insulating layer;
  depositing and patterning a second metal layer on the semiconductor channel to form a source and a drain of the thin film transistor, wherein the source and the drain are contacted with the semiconductor channel individually;
  wherein the step of patterning the first protection layer comprises:
    patterning the first protection layer to remain the first protection layer on the semiconductor layer which forms a first electrode of a storage capacitor, wherein a thickness of the first protection layer on the semiconductor layer which forms the first electrode of the storage capacitor is smaller than a thickness of the first protection layer covering the semiconductor layer which forms the semiconductor channel.

5. The manufacturing method as claimed in claim 4, wherein the step of patterning the first protection layer comprises:
  making that in the first protection layer covering the semiconductor layer which forms the semiconductor channel, a thickness of the first protection layer covering the semiconductor layer which forms a portion of the semiconductor channel contacted with the source and the drain is smaller than a thickness of the first protection layer covering the semiconductor layer which forms the other of the semiconductor channel;

after using the patterned first protection layer as a mask to pattern the semiconductor layer to remove the semiconductor layer uncovered by the patterned first protection layer, further comprises:

etching the first protection layer covering the semiconductor layer which forms the semiconductor channel to remove the first protection covering the semiconductor layer which forms the portion of the semiconductor channel contacted with the source and the drain and thereby to expose the semiconductor layer which forms the portion of the semiconductor channel contacted with the source and the drain;

using the etched first protection layer as a mask to perform metallization on the exposed semiconductor layer which forms the portion of the semiconductor channel contacted with the source and the drain, to form the semiconductor channel of the thin film transistor on the gate insulating layer.

6. The manufacturing method as claimed in claim 5, wherein
a material of the semiconductor layer is indium gallium zinc oxide;
the step of etching the first protection layer covering the semiconductor layer which forms the semiconductor channel further comprises:
removing the first protection layer on the semiconductor layer which forms the first electrode of the storage capacitor to expose the semiconductor layer which forms the first electrode of the storage capacitor;
the step of using the etched first protection layer as a mask to perform metallization on the exposed semiconductor layer which forms the portion of the semiconductor channel contacted with the source and the drain further comprises:
using the etched first protection layer as a mask to perform metallization on the exposed semiconductor layer which forms the first electrode of the storage capacitor, to form the first electrode of the storage capacitor.

7. The manufacturing method as claimed in claim 6, wherein
a thickness of the first protection layer on the semiconductor layer which forms the first electrode of the storage capacitor and the thickness of the first protection layer covering the semiconductor layer which forms the portion of the semiconductor channel contacted with the source and the drain are the same, and each is a half of the thickness of the first protection layer covering the semiconductor layer which forms the other of the semiconductor channel.

8. The manufacturing method as claimed in claim 6, after the step of depositing and patterning a second metal layer on the semiconductor channel to form the source and the drain of the thin film transistor, further comprising:
forming a second protection layer on the substrate formed with the source and the drain;
forming a via hole in the second protection layer above the drain;
forming a transparent conductive layer on the second protection layer as a second electrode of the storage capacitor and making the transparent conductive layer to connect with the drain through the via hole.

9. A manufacturing equipment of an array substrate, comprising:
a coating mechanism;
a first mask, configured for patterning a first metal layer to form a gate of a thin film transistor, after the coating mechanism coating the first metal layer on a substrate;
a second mask, configured for patterning an insulating layer to form a gate insulating layer of the thin film transistor, after the coating mechanism coating the insulating layer on the gate;
a third mask, configured for patterning a first protection layer to remove a part of the first protection layer and at least remaining the first protection layer covering a semiconductor layer which forms a semiconductor channel of the thin film transistor to thereby use the remained first protection layer as a mask to pattern the semiconductor layer so as to remove the semiconductor layer uncovered by the remained first protection layer and form the semiconductor channel of the thin film transistor on the gate insulating layer, after the coating mechanism sequentially coating the semiconductor layer and the first protection layer on the gate insulating layer;
a fourth mask, configured for patterning a second metal layer to form a source and a drain of the thin film transistor, after the coating mechanism coating the second metal layer on the semiconductor channel, wherein the source and the drain are contacted with the semiconductor channel individually;
wherein the third mask further is configured for patterning the first protection layer to remain the first protection layer on the semiconductor layer which forms a first electrode of a storage capacitor, wherein a thickness of the protection layer on the semiconductor layer which forms the first electrode of the storage capacitor is smaller than a thickness of the first protection layer covering the semiconductor layer which forms the semiconductor channel.

10. The manufacturing equipment as claimed in claim 9, wherein
the third mask is configured for pattering the first protection layer to make that in the first protection layer covering the semiconductor layer which forms the semiconductor channel, a thickness of the first protection layer covering the semiconductor layer which forms a portion of the semiconductor channel contacted with the source and the drain is smaller than a thickness of the first protection layer covering the semiconductor layer which forms the other of the semiconductor channel;
the manufacturing equipment further comprises:
an etching mechanism, configured for etching the first protection layer covering the semiconductor layer which forms the semiconductor channel to remove the first protection layer covering the semiconductor layer which forms the portion of the semiconductor channel contacted with the source and the drain and to thereby expose the semiconductor layer which forms the portion of the semiconductor channel contacted with the source and the drain;
a metallization mechanism, configured for using the etched first protection layer as a mask to perform metallization on the exposed semiconductor layer which forms the portion of the semiconductor channel contacted with the source and the drain to form the semiconductor channel of the thin film transistor on the gate insulating layer.

11. The manufacturing equipment as claimed in claim 10, wherein
- a material of the semiconductor layer is indium gallium zinc oxide;
- the etching mechanism further is configured for etching the first protection layer on the semiconductor layer which forms the first electrode of the storage capacitor to remove the first protection layer on the semiconductor layer which forms the first electrode of the storage capacitor and to thereby expose the semiconductor layer which forms the first electrode of the storage capacitor;
- the metallization mechanism further is configured for using the etched first protection layer as a mask to perform metallization on the exposed semiconductor layer which forms the first electrode of the storage capacitor to form the first electrode of the storage capacitor.

12. The manufacturing equipment as claimed in claim 11, wherein
- a thickness of the first protection layer on the semiconductor layer which forms the first electrode of the storage capacitor and the thickness of the first protection layer covering the semiconductor layer which forms the portion of the semiconductor channel contacted with the source and the drain are the same, and each is a half of the thickness of the first protection layer covering the semiconductor layer which forms the other of the semiconductor channel.

13. The manufacturing equipment as claimed in claim 11, wherein
- the coating mechanism further is configured for coating a second protection layer on the substrate formed with the source and the drain;
- the manufacturing equipment further comprises a fifth mask configured for patterning the second protection layer to form a via hole in the second protection layer directly above the drain;
- the coating mechanism further is configured for coating a transparent conductive layer on the second protection layer as a second electrode of the storage capacitor and making the transparent conductive layer to connect with the drain through the via hole.

* * * * *